United States Patent [19]

Wu et al.

[11] Patent Number: 5,256,594

[45] Date of Patent: Oct. 26, 1993

[54] MASKING TECHNIQUE FOR DEPOSITING GALLIUM ARSENIDE ON SILICON

[75] Inventors: Albert T. Wu, San Jose, Calif.; Shinji Nozaki, Tokyo, Japan; Thomas George, Albany; Sandra S. Lee, Los Altos, both of Calif.; Masayoshi Umeno, Nagoya, Japan

[73] Assignee: Intel Corporation, Santa Clara, Calif.

[21] Appl. No.: 367,547

[22] Filed: Jun. 16, 1989

[51] Int. Cl.$^5$ ............................................. H01L 21/205
[52] U.S. Cl. ..................................... 437/89; 437/107; 437/132; 427/255.2
[58] Field of Search ................... 148/DIG. 22, 26, 50, 148/56, 65, 72, 81, 97, 104, 106, 110, 118, 149, 169; 156/610–614; 427/255, 248.1, 252, 255.1; 437/81, 89, 90, 99, 105, 107, 126, 132, 924, 948, 962, 976, 978, 984

[56] References Cited

U.S. PATENT DOCUMENTS

| | | | |
|---|---|---|---|
| 4,045,594 | 8/1977 | Maddocks | 427/89 |
| 4,551,394 | 11/1985 | Betsch et al. | 437/132 |
| 4,657,603 | 4/1987 | Kruehler et al. | 437/132 |
| 4,774,205 | 9/1988 | Choi et al. | 156/610 |
| 4,808,551 | 2/1989 | Mori et al. | 437/126 |
| 4,826,784 | 5/1989 | Salerno et al. | 437/132 |
| 4,835,116 | 5/1989 | Lee et al. | 437/126 |
| 4,876,218 | 10/1989 | Pessa et al. | 437/107 |
| 4,900,372 | 2/1990 | Lee et al. | 437/126 |
| 4,910,167 | 3/1990 | Lee et al. | 437/107 |

FOREIGN PATENT DOCUMENTS

| | | | |
|---|---|---|---|
| 0213117 | 9/1987 | Japan | 437/132 |
| 1246294 | 9/1971 | United Kingdom . | |
| 1418278 | 12/1975 | United Kingdom . | |
| 1467145 | 3/1977 | United Kingdom . | |

OTHER PUBLICATIONS

Matyi et al., "Patterned Growth of Gallium Arsenide on Silicon", J. Vac. Sci. Technol. B 6(2), Mar./Apr. 1988, pp. 699–702.

Soga et al., "Selective MOCVD Growth of GaAs on Si . . . ", Jpn. J. Appl. Phys., vol. 26, No. 2, Feb. 1987, pp. 252–255.

Yamaguchi et al., "Selective Epitaxial Growth of GaAs by Metalorganic Chemical Vapor Deposition", Jpn. J. Appl. Phys., vol. 24, No. 12, Dec., 1985, pp. 1666–1671.

Hong et al., "Selective-Area Epitaxy of GaAs Through Silicon Dioxide Windows by Molecular Beam Epitaxy", Appl. Phys. Lett., 48(2), Jan. 13, 1986, pp. 142–144.

"Heterointerface Stability in GaAs-on-si Grown by Metalorganic Chemical Vapor Deposition" Applied Physics Letters, vol. 51, No. 9, p. 602 (Aug. 31, 1987).

"DefectRelated Si Diffusion in GaAs-on-Si" Applied Physics Letters, vol. 53, No. 26 p. 2635 (Dec. 26, 1988).

"Growth and Properties of GaAs/Al GaAs on Nonpolar Substrates Using Molecular Beam Epitaxy" Journal of Applied Physics, vol. 58, No. 1, p. 374 (Jul. 1, 1985).

"Effect of Post-Growth Annealing on Patterned GaAs on Silicon" Applied Physics Letters, vol. 53, No. 26 p. 2611 (Dec. 26, 1988).

*Primary Examiner*—Olik Chaudhuri
*Assistant Examiner*—Ourmazd S. Ojan
*Attorney, Agent, or Firm*—Blakely, Sokoloff, Taylor & Zafman

[57] ABSTRACT

A process for forming GaAs on a silicon substrate with very low levels of unintended silicon doping. First, a dielectric layer of silicon dioxide, silicon nitride, or both is grown or deposited on the substrate. Next, a window is opened in the dielectric layer exposing the silicon substrate in the regions in which the GaAs is to be formed. The GaAs layer is then formed on the substrate using conventional techniques with the gas phase transfer of silicon contamination from the edges and back of the silicon substrate to the GaAs region inhibited by the dielectric layer or layers.

29 Claims, 5 Drawing Sheets

FIG_1
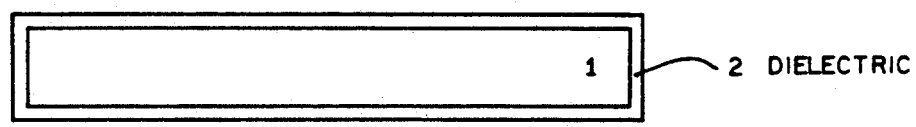
FIG_2
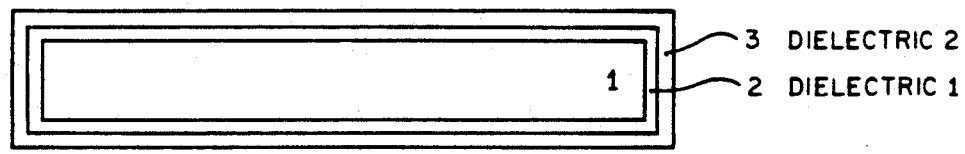
FIG_3
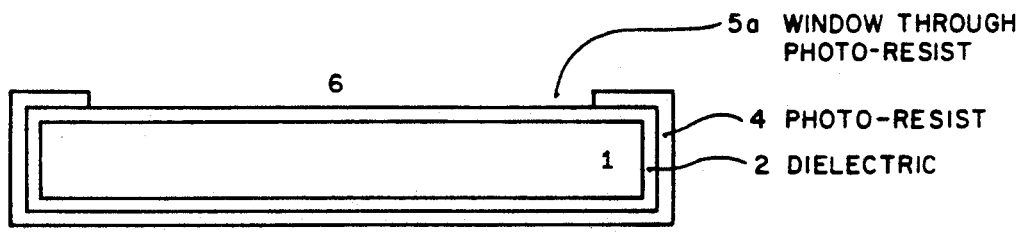
FIG_4
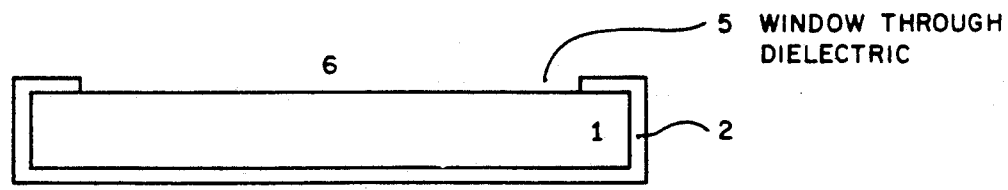

FIG_5
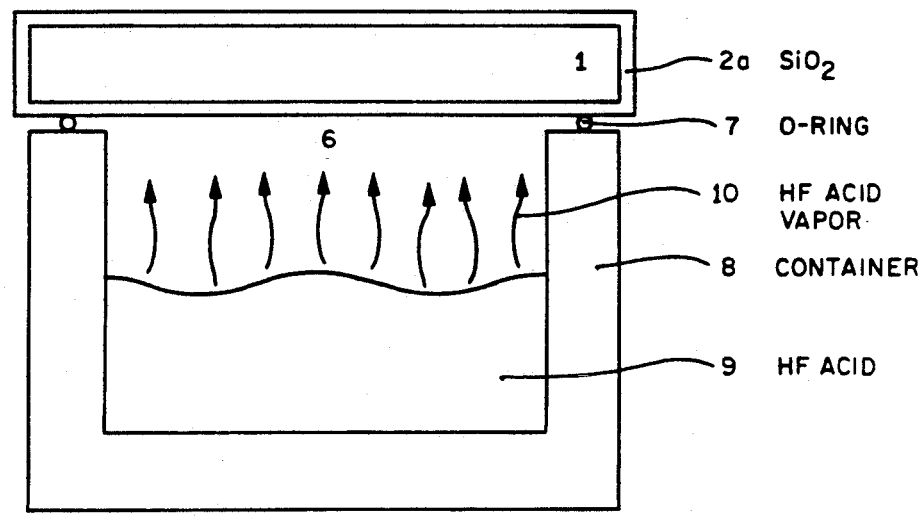
FIG_6
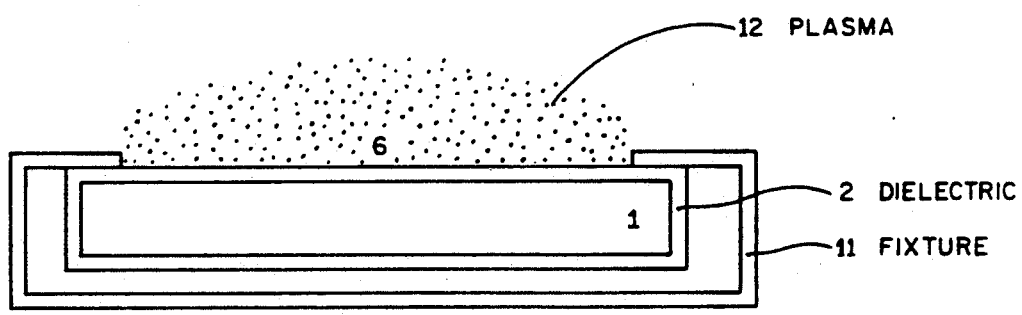

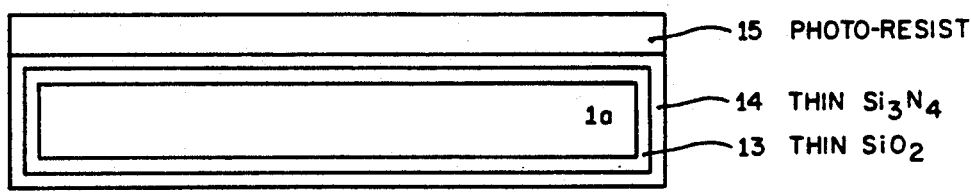
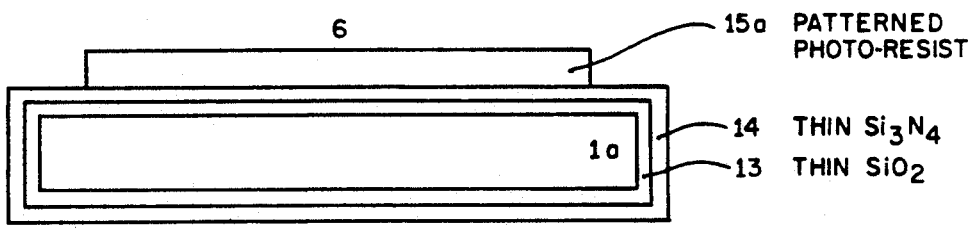
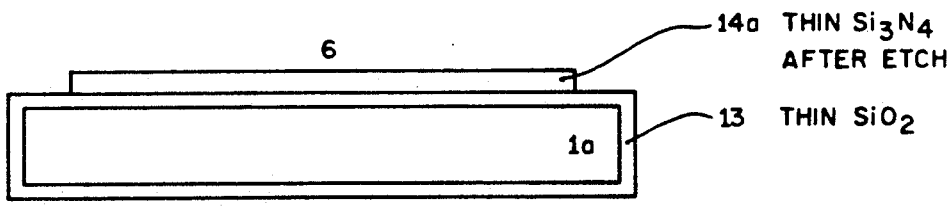
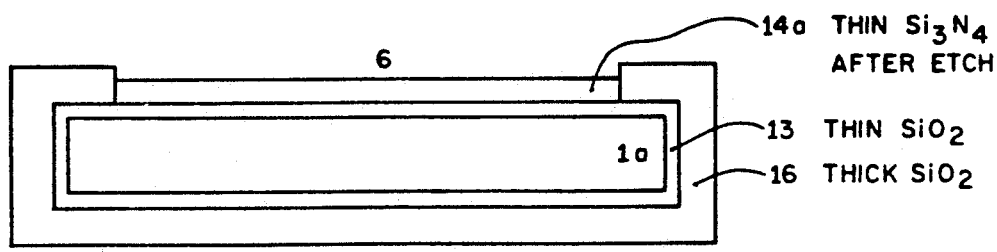

FIG_11
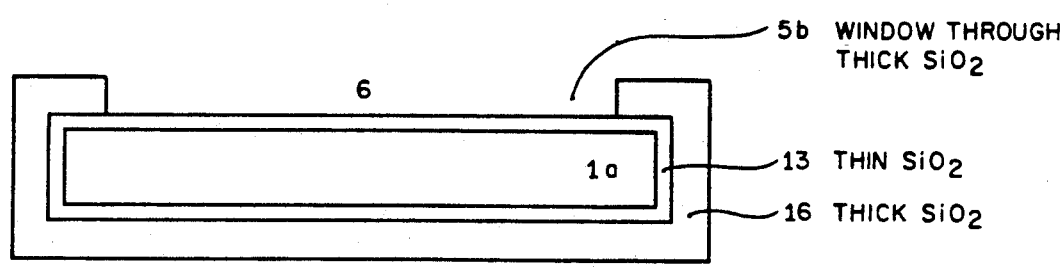
FIG_12
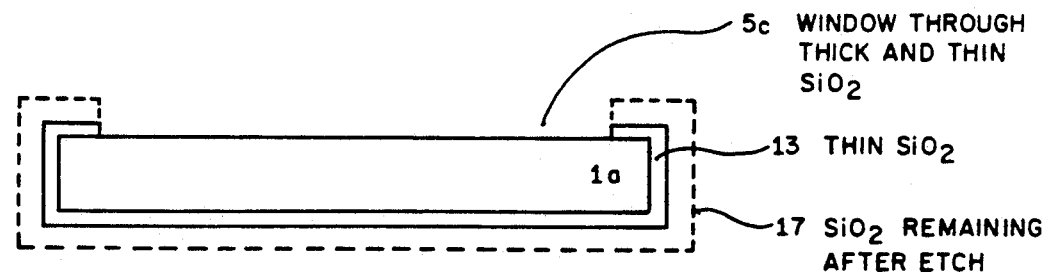

FIG_13
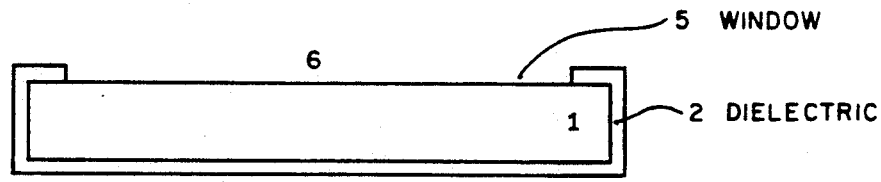
FIG_14
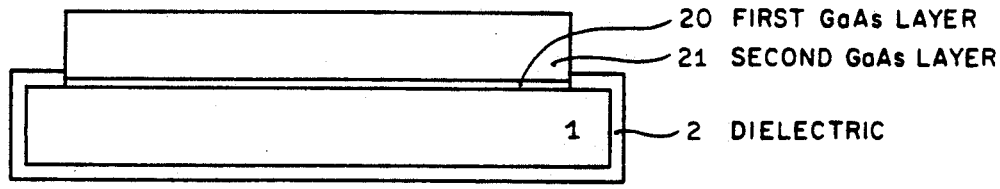
FIG_15
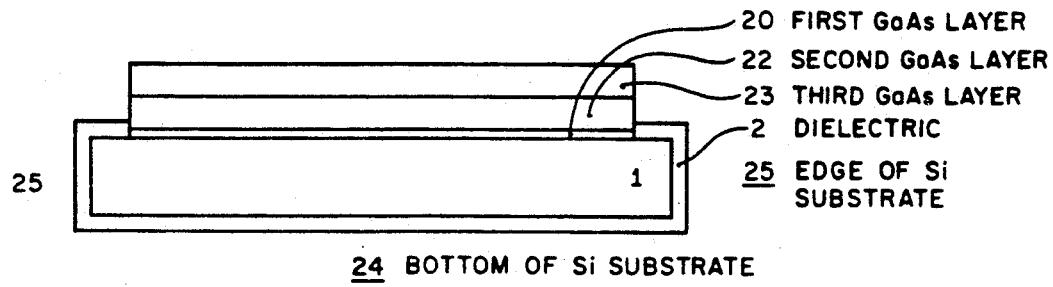

MASKING TECHNIQUE FOR DEPOSITING GALLIUM ARSENIDE ON SILICON

BACKGROUND OF THE PRESENT INVENTION

1. Field of the Invention

This invention relates to the field of semiconductor devices and more specifically to heteroepitaxial formation of gallium arsenide (GaAs) crystals on silicon substrates (GaAs-on-Si).

2. Prior Art

GaAs substrates are currently used in the manufacture of a variety of electronic devices such as very high speed integrated circuits (IC's) and photoelectronic devices, such as solar cells, light emitting diodes (LEDs) and lasers. GaAs IC's have the advantage of being higher speed than similar IC's fabricated on silicon wafers.

Disadvantages of utilizing GaAs substrates for semiconductor device manufacturing include the high cost of GaAs substrates, non-availability of large, cost effective substrates compared with available silicon substrates and fragility of GaAs substrates leading to a high breakage rate and consequently, low yield during manufacture.

Efforts have been made to epitaxially form GaAs on a silicon substrate (heteroepitaxy). The advantages of combining GaAs and silicon technologies are that very high speed GaAs electronic and photoelectronic devices may be fabricated using the low cost, large diameter and mechanically strong silicon substrates.

Some of the more significant problems inherent in the heteroepitaxial formation of GaAs on silicon are: 1) lattice parameter mismatch; and 2) thermal expansion mismatch. Lattice parameter mismatch refers to the difference in the lattice constant of the GaAs crystal compared with that of the silicon crystal. The lattice parameter mismatch leads to a high density of dislocation defects in approximately the first 0.1 micron of the GaAs layer. Thermal mismatch refers to the difference in the thermal expansion coefficient of GaAs compared with that of silicon. Because GaAs has a greater thermal expansion coefficient, it shrinks more than the silicon substrate during cool down from the high temperature formation of the GaAs layer, causing high tensile stress in the GaAs layer.

Another problem, silicon autodoping in the GaAs layer, results from the incorporation of silicon from the silicon substrate into the heteroepitaxially formed GaAs layer. Silicon acts as an n-type dopant in GaAs and a result of this unintended doping is that control of device characteristics becomes extremely difficult.

The mechanism of the silicon incorporation into the GaAs film is described in the prior art as diffusion of silicon from the silicon-GaAs interface (heterointerface). The extent of silicon incorporation in the GaAs layer is greater during high temperature growth and annealing processes. The diffusion of silicon into the GaAs layer is thought to be enhanced by preferential diffusion channels created by the high level of dislocation defects in the first 0.1 micron of the GaAs layer. Efforts to reduce the amount of unintended silicon doping in the GaAs layer have been to form the GaAs layer at low growth temperatures. However, low formation temperature processes result in lower quality GaAs crystal than that obtained from high temperature formation processes. High temperature formation is therefore preferred if silicon autodoping can be avoided. The problem of diffusion of silicon into the GaAs layer is discussed in "Heterointerface Stability in GaAs-on-Si Grown by Metalorganic Chemical Vapor Deposition" *Applied Physics Letters*, Vol. 51, No. 9, p. 682 (Aug. 31, 1987) and "Defect Related Si Diffusion in GaAs-on-Si" *Applied Physics Letters*, Vol. 53, No. 26 p. 2635 (Dec. 26, 1988).

The present invention is directed toward inhibiting the silicon autodoping in the GaAs layer.

SUMMARY OF THE INVENTION

The present invention describes a process for inhibiting the incorporation of silicon into the heteroepitaxially formed GaAs layer. The invention is directed toward inhibiting silicon incorporation into the GaAs layer through gas phase transport of silicon from the bottom and edges of the silicon substrate to the GaAs layer during the heteroepitaxy process. A dielectric layer comprised of silicon dioxide, silicon nitride or both is first grown or deposited on the silicon substrate. Next, a window is opened through the dielectric layer exposing the silicon substrate in the region in which the GaAs is to be formed. During the heteroepitaxial formation of GaAs, because the bottom and edges of the silicon substrate are covered with the dielectric layer, gas phase transport of silicon from these regions to the GaAs layer is inhibited.

BRIEF DESCRIPTION OF THE DRAWINGS

FIG. 1 is a cross-sectional view of a silicon substrate with a dielectric layer formed thereon.

FIG. 2 is a cross-sectional view of a silicon substrate with two dielectric layers formed thereon.

FIG. 3 is a cross-sectional view of the semiconductor body of FIG. 1 with a covering of photoresist on the top, bottom and edges thereof, and a window opened in the photoresist in the region in which the GaAs is to be formed.

FIG. 4 is a cross-sectional view of the semiconductor body of FIG. 3 with a window etched through the dielectric layer and the photoresist removed.

FIG. 5 is a cross-sectional view of the semiconductor body of FIG. 1 on a special apparatus to etch the dielectric layer thereon.

FIG. 6 is a cross-sectional view of the semiconductor body of FIG. 1 shown in a special fixture for plasma etching the dielectric layer thereon.

FIG. 7 is a cross-sectional view of an alternative embodiment showing a silicon substrate with a thin silicon dioxide layer and a thin silicon nitride layer thereon with photoresist covering the top side of the wafer.

FIG. 8 is a cross-sectional view of the semiconductor body of FIG. 7 with the photoresist remaining after exposure and development.

FIG. 9 is a cross-sectional view of the semiconductor body of FIG. 8 with that portion of the silicon nitride layer not covered by the photoresist of FIG. 8 etched and the photoresist subsequently removed.

FIG. 10 is a cross-sectional view of the semiconductor body of FIG. 9 with a thick silicon dioxide layer formed on the portions of the substrate where the silicon nitride has been removed.

FIG. 11 is a cross-sectional view of the semiconductor body of FIG. 10 with the remaining silicon nitride removed.

FIG. 12 is a cross-sectional view of the semiconductor body of FIG. 11 with the thin silicon dioxide removed in the region from which the remaining silicon nitride was removed.

FIG. 13 is a cross-sectional view of a silicon substrate with dielectric layer thereon with a window formed through the dielectric exposing the silicon substrate.

FIG. 14 is a cross-sectional view of the semiconductor body of FIG. 13 with 2 gallium arsenide layers grown thereon.

FIG. 15 is a cross-sectional view of the semiconductor body of FIG. 13 with 3 gallium arsenide layers grown thereon.

DETAILED DESCRIPTION OF THE PRESENT INVENTION

An invention is described for forming a GaAs layer on a silicon substrate (GaAs-on-Si) in which silicon autodoping in the GaAs layer is inhibited. In the following description, numerous specific details are set forth such as specific thicknesses, etc. in order to provide a thorough understanding of the present invention. It will be obvious, however, to one skilled in the art, that the present invention. It will be obvious, however, to one skilled in the art, that the present invention may be practiced without these specific details. In other instances, well-known processes have not been described in detail in order not to unnecessarily obscure the present invention.

Referring to FIG. 1, a silicon substrate 1 is shown having a dielectric layer 2 formed thereon. Silicon substrate 1 can be a bare silicon substrate or it can be a silicon substrate with semiconductor devices formed thereon. The dielectric layer 2 is deposited on the silicon substrate 1 using one of a variety of well-known prior art techniques, such as chemical vapor deposition (CVD). The dielectric layer 2 is formed from a variety of dielectric materials including but not limited to materials such as silicon dioxide ($SiO_2$) or silicon nitride ($Si_3N_4$). The thickness of the dielectric layer 2 can vary significantly but in the preferred embodiment the thickness is approximately 200 to 10,000 angstroms.

Alternatively, multiple dielectric layers can be formed. Such an arrangement is shown in FIG. 2 where the silicon substrate 1 has two dielectric layers 2 and 3. The two dielectric layers 2 and 3 can be formed from a variety of dielectric materials including but not limited to materials such as silicon dioxide ($SiO_2$) and silicon nitride ($Si_3N_4$) in either order. Layers 2 and 3 are formed by one of a variety of well-known prior art techniques such as CVD. The thickness of each dielectric layer can vary significantly but in the preferred embodiment the thickness of each is approximately 200 to 10,000 angstroms.

Referring to FIGS. 3 and 4, they show the preferred method for opening a window 5 in the dielectric layer 2 to expose the silicon substrate in the region 6 overlying the silicon substrate 1 in which the GaAs is to be formed. The silicon substrate 1 shown in FIG. 3 with the single dielectric 2 is covered front, back and edge with photoresist 4. That is, silicon substrate 1 is completely surrounded by dielectric layer 2 and photoresist layer 4. The photoresist layer 4 is masked, exposed and developed on the top side of the wafer using one of a variety of well-known prior art photolithographic techniques to expose an opening (window) 5a in the region 6 in which GaAs is to be formed. Then, dielectric layer 2 is etched so that the exposed areas of dielectric layer 2 at window 5a is etched away.

FIG. 4 shows the silicon substrate 1 with single dielectric layer 2 after the dielectric layer 2 has been etched in the region of the window 5a of FIG. 3 to provide window 5 through the dielectric. FIG. 4 shows dielectric 2 with window 5 on silicon substrate 1 after the photoresist 4 of FIG. 3 has been removed. The surface of silicon substrate 1 in the region 6 in which the GaAs is to be formed is now exposed.

Alternatively, the window 5 for exposing a portion of the silicon substrate 1 can be formed by etching dielectric layer 2 directly without a photolithography step using a special apparatus. FIGS. 5 and 6 show two such alternative techniques. Referring to FIG. 5, the silicon substrate 1 having $SiO_2$ layer 2a is shown in a special apparatus for etching the $SiO_2$ layer 2a. The apparatus is a closed container, but having an opening at the top to allow placement of the silicon substrate 1. The apparatus allows etchant to come into contact with $SiO_2$ layer 2a only in the region 6 in which the GaAs is to be formed. The silicon substrate 1 is placed face down on O-ring 7 on top of container 8. A hydrofluoric acid (HF) solution 9 (or buffered hydrofluoric acid (BHF) is in the container 8. The $SiO_2$ layer 2a is etched in the region 6 in which the GaAs is to be formed by the HF vapor 10 forming window 5 in $SiO_2$ layer 2a.

Referring to FIG. 6, the silicon substrate 1 shown with single dielectric layer 2 is placed in a fixture 11. The fixture 11 is placed in a plasma etcher where plasma 12 etches the dielectric layer 2 in the region 6 in which the GaAs is to be formed, such plasma etching techniques being well-known in the prior art. It is to be appreciated that although a single dielectric layer 2 is shown in FIG. 6, other structures such as the dual dielectric layer device of FIG. 2 can be readily used without departing from the spirit and scope of the invention.

Referring to FIG. 7 through 11, an alternative embodiment with silicon substrate 1a having a thin $SiO_2$ layer 13 and thin $Si_3N_4$ layer 14 is shown. The thickness of the $SiO_2$ layer 13 is approximately in the 200 angstrom through 2,000 angstrom range. The thickness of the $Si_3N_4$ layer 14 is approximately in the 500 angstrom through 2000 angstrom range. Covering the top side of the silicon substrate is photoresist layer 15.

The photoresist layer 15 is then masked, exposed and developed using one of a variety of well-known prior art photolithographic techniques such that a patterned photoresist region 15a is left covering the thin $SiO_2$ layer 13 and thin $Si_3N_4$ layer 14 over the region 6 in which the GaAs layer is to be formed.

Next, the $Si_3N_4$ layer 14 is etched by using one of a variety of well-known prior art techniques and the photoresist is removed so that there remains the thin $SiO_2$ layer 13 over the top, bottom and edges surrounding silicon substrate 1a and the thin $Si_3N_4$ layer 14a atop the thin $SiO_2$ layer 13 only in the region 6 in which the GaAs layer is to be formed.

Then, as shown in FIG. 10, an additional thick $SiO_2$ layer 16 is grown using one of a variety of well-known prior art techniques on top of the thin $SiO_2$ layer 13. The thickness of $SiO_2$ layer 16 is in the range of 1,000 to 10,000 angstroms.

Referring to FIG. 11, the thin $Si_3N_4$ layer 14a is then etched away using one of a variety of well-known prior art techniques to form window 5b through the thick $SiO_2$ layer 16 in the region 6 in which the GaAs is to be formed. The silicon substrate 1a then has thin $SiO_2$ layer 13 over the region 6 in which the GaAs is to be formed and both thin SiO$_2$ layer 13 and thick SiO$_2$ layer 16 elsewhere. Finally, an SiO$_2$ etch is performed using one of a variety of well-known prior art techniques until the silicon substrate 1a is exposed in the region 6 in which the GaAs is to be formed as shown in FIG. 12. The thick SiO$_2$ layer 16 is reduced in thickness by approximately the thickness of the thin SiO$_2$ layer 13 of region 6. The SiO$_2$ remaining on the edges and bottom of the silicon substrate 1a is comprised of the thin SiO$_2$ layer 13 and the unetched portion of the thick SiO$_2$ layer 16, and is approximately equal to the thickness added to form the thick SiO$_2$ layer 16 of FIG. 10. That is, the remaining SiO$_2$, as shown by dotted line 17 of FIG. 12 is approximately 1,000 to 10,000 angstroms thick.

Although the embodiments described above disclose specific materials and methods for forming a dielectric layer or layers on the top, bottom and edge of a silicon substrate with a window through the dielectric layer(s) to expose the silicon substrate in the region in which the GaAs is to be formed, it will be obvious to one skilled in the art that there are other well-known prior art methods and materials to practice the present invention.

Referring to FIG. 13, once the silicon substrate 1 has been covered with the dielectric layer 2 on the top, bottom and edges and a window 5 has been opened through the dielectric layer 2 to the silicon substrate 1 on the top side, the GaAs layer is formed on the exposed region of the silicon substrate 1.

Typically, the device of FIG. 13 will undergo a cleaning cycle before the GaAs layer formation on the surface. A typical cleaning sequence is comprised of degreasing in trichloroethane for 10 minutes, acetone for 5 minutes and then methyl alcohol for 5 minutes. This is followed by a deionized water rinse, then a sulfuric acid (H$_2$SO$_4$)/hydrogen peroxide (H$_2$O$_2$) dip for 4 minutes (H$_2$SO$_4$:H$_2$O$_2$=4:1), followed by a second deionized water rinse and finally a hydrofluoric acid(HF)-/water(H$_2$O) dip for 1 minute (HF:H$_2$O = 1:1).

It will be obvious, however, to one skilled in the art that a number of prior art cleaning processes may be used in place of the above described process before the GaAs formation.

In the preferred embodiment, the GaAs is formed in two steps. The silicon substrate 1 with dielectric layer 2 having window 5 as in FIG. 13 is loaded into a metalorganic chemical vapor deposition (MOCVD) chamber. The silicon substrate 1 is initially heat treated. Typical heat treatment conditions are under arsine gas (AsH$_3$) flow of about 10 cubic centimeters per minute (cc/min) at 1,000° C. for 10 minutes. Gallium arsenide formation occurs with arsine (AsH$_3$) and trimethylgallium (TMG) flowing through the MOCVD chamber. The first formation step of the preferred embodiment is a low temperature formation. Typical conditions are a temperature of 400° C., molar flow rate of AsH$_3$ to molar flow rate of TMG of 80 to 1 (molar flow rate ratio of AsH$_3$ to TMG) and a time of 5 minutes. This will result in GaAs layer 20 having a thickness of approximately 125 angstroms as shown in FIG. 14. The second formation step to form GaAs layer 21 occurs at a temperature of 750° C., and a molar flow rate ratio of AsH$_3$ to TMG of 40 to 1. The time of formation will vary according to the desired thickness of the GaAs layer 21. For a desired thickness of 3 microns, the second formation step proceeds for approximately 60 minutes.

In an alternative embodiment shown in FIG. 15, the formation of a GaAs layer occurs in three steps. The device of FIG. 13 is placed in the MOCVD chamber and undergos the same heat treatment and low temperature formation as in the preferred embodiment. The second formation step of the alternative embodiment proceeds at a temperature of 650° C., at a molar flow rate ratio of AsH$_3$ to TMG of 40 to 1 and for a time of 30 minutes to form a GaAs layer 22 having a thickness of approximately 1.5 microns. The third formation step proceeds at 750° C., molar flow rate ratio of AsH$_3$ to TMG of 40 to 1 for 30 minutes to form a GaAs layer 23 having a thickness of approximately 1.5 microns.

Alternatively, it is appreciated that the present invention can be practiced using other well-known prior art techniques to form GaAs layers 20 and 21 or 20, 22 and 23 including, for example, metalorganic vapor phase epitaxy (MOVPE) and molecular beam epitaxy (MBE). For a discussion of MOVPE see "Detect Related Si Diffusion in GaAs-on-Si" *Applied Physics Letters*, Vol. 53, No. 26 p. 2635 (Dec. 26, 1988), for a discussion of MBE see "Growth and Properties of GaAs/AlGaAs on Nonpolar Substrates Using Molecular Beam Epitaxy" *Journal of Applied Physics*, Vol. 58, No. 1 p. 374 (Jul. 1, 1985) and "Effect of Post-Growth Annealing on Patterned GaAs on Silicon" *Applied Physics Letters*, Vol. 53, No. 26 p. 2611 (Dec. 26, 1988). Further, other embodiments, such as that shown in FIG. 2 or FIG. 12, can be readily used for the device shown in FIG. 13.

Referring to FIG. 15 it can be seen that the dielectric layer 2 covers the silicon substrate 1 on the bottom 24 and edges 25 of the silicon substrate 1. Without this covering, silicon would be released in the gas phase from the bottom 24 and edges 25 of the silicon substrate 1. This released silicon would then be deposited in the GaAs layers 20, 21, 22, and 23 throughout their formation, resulting in unintended Si doping in the GaAs layers 20, 21, 22, and 23. Because the present invention causes the bottom 24 and edges 25 of silicon substrate 1 to be covered with dielectric, these areas are effectively sealed. This seal prevents the release of silicon from the silicon substrate 1 during the heteroepitaxy process. In this way, silicon autodoping of the GaAs layer is inhibited.

Although the present invention describes a preferred and alternative embodiments of the present invention, using specific materials and parameters, it will be obvious to one skilled in the art that such may be varied within the spirit and scope of the invention.

A novel method for forming GaAs on Si which prevents autodoping of Si in the GaAs layer formed is described.

We claim:

1. A process for the formation of gallium arsenide on a silicon substrate in which silicon contamination of the GaAs layer is inhibited comprising the steps of:
   depositing a dielectric layer on said substrate to substantially cover the top, bottom and edge of said substrate;
   exposing a predetermined region of said substrate by removing portions of said dielectric layer;
   forming a gallium arsenide layer on said predetermined region of said substrate.

2. The process as described in claim 1 wherein said dielectric layer is comprised of silicon dioxide having a thickness of approximately 200–10,000 angstroms.

3. The process as described in claim 1 wherein said dielectric layer is comprised of silicon nitride having a thickness of approximately 200–10,000 angstroms.

4. The process as described in claim 1 wherein said gallium arsenide layer is formed by metalorganic chemical vapor deposition.

5. The process as described in claim 2 wherein said gallium arsenide layer is formed by metalorganic chemical vapor deposition.

6. The process as described in claim 3 wherein said gallium arsenide layer is formed by metalorganic chemical vapor deposition.

7. The process as described in claim 1 wherein said gallium arsenide layer is formed by metalorganic vapor phase epitaxy.

8. The process as described in claim 2 wherein said gallium arsenide layer is formed by metalorganic vapor phase epitaxy.

9. The process as described in claim 3 wherein said gallium arsenide layer is formed by metalorganic vapor phase epitaxy.

10. The process as described in claim 1 wherein said gallium arsenide layer is formed by molecular beam epitaxy.

11. The process as described in claim 2 wherein said gallium arsenide layer is formed by molecular beam epitaxy.

12. The process as described in claim 3 wherein said gallium arsenide layer is formed by molecular beam epitaxy.

13. A process for the formation of gallium arsenide on a silicon substrate in which silicon contamination of the GaAs layer is inhibited comprising the steps of:
   depositing a first dielectric layer on the top, bottom and edge of said substrate;
   depositing a second dielectric layer on said first dielectric layer;
   exposing a predetermined region of said substrate by removing portions of said first and said second dielectric layers;
   forming a gallium arsenide layer on said predetermined region.

14. The process as described in claim 13 wherein said first dielectric layer is comprised of silicon dioxide having a thickness of approximately 200–10,000 angstroms, and said second dielectric layer is comprised of silicon nitride having a thickness of approximately 500–10,000 angstroms.

15. The process as described in claim 13 wherein said first dielectric layer is comprised of silicon nitride having a thickness of approximately 500–10,000 angstroms, and said second dielectric layer is comprised of silicon dioxide having a thickness of approximately 200–10,000 angstroms.

16. The process as described in claim 13 wherein said gallium arsenide layer is formed by metalorganic chemical vapor deposition.

17. The process as described in claim 14 wherein said gallium arsenide layer is formed by metalorganic chemical vapor deposition.

18. The process as described in claim 15 wherein said gallium arsenide layer is formed by metalorganic chemical vapor deposition.

19. The process as described in claim 13 wherein said gallium arsenide layer is formed by metalorganic vapor phase epitaxy.

20. The process as described in claim 14 wherein said gallium arsenide layer is formed by metalorganic vapor phase epitaxy.

21. The process as described in claim 15 wherein said gallium arsenide layer is formed by metalorganic vapor phase epitaxy.

22. The process as described in claim 13 wherein said gallium arsenide layer is formed by molecular beam epitaxy.

23. The process as described in claim 14 wherein said gallium arsenide layer is formed by molecular beam epitaxy.

24. The process as described in claim 15 wherein said gallium arsenide layer is formed by molecular beam epitaxy.

25. A process for the formation of gallium arsenide on a silicon substrate in which silicon contamination of the GaAs layer is inhibited comprising the steps of:
   depositing a first silicon dioxide layer of approximately 200–2000 angstroms thickness on said substrate;
   depositing a silicon nitride layer of approximately 500–2000 angstroms thickness on said first silicon dioxide layer;
   removing a portion of said silicon nitride layer such that a predetermined region of said silicon nitride layer remains atop said first silicon dioxide layer;
   depositing a second silicon dioxide layer on said first silicon dioxide layer;
   removing said predetermined region of said silicon nitride layer to expose an underlying predetermined region of said first silicon dioxide layer;
   removing said underlying predetermined region of said first silicon dioxide layer to expose a portion of said silicon substrate;
   forming a gallium arsenide layer on said exposed portion of said silicon substrate.

26. The process as described in claim 25 wherein said gallium arsenide layer is formed by metalorganic chemical vapor deposition.

27. The process as described in claim 25 wherein said gallium arsenide layer is formed by metalorganic vapor phase epitaxy.

28. The process as described in claim 25 wherein said gallium arsenide layer is formed by molecular beam epitaxy.

29. The process as described in claim 25 wherein said first silicon dioxide layer is deposited on the top, bottom and edge of said substrate.

* * * * *